(12) United States Patent
Lamb

(10) Patent No.: US 11,214,056 B2
(45) Date of Patent: Jan. 4, 2022

(54) DRIVER CIRCUIT

(71) Applicant: Fen Technology Holdings Limited, Cambridge (GB)

(72) Inventor: Kevin Lamb, Cambridge (GB)

(73) Assignee: Fen Technology Limited, Cambridgeshire (GB)

( * ) Notice: Subject to any disclaimer, the term of this patent is extended or adjusted under 35 U.S.C. 154(b) by 0 days.

(21) Appl. No.: 16/632,860

(22) PCT Filed: Jul. 20, 2018

(86) PCT No.: PCT/GB2018/052061
§ 371 (c)(1),
(2) Date: Jan. 21, 2020

(87) PCT Pub. No.: WO2019/016568
PCT Pub. Date: Jan. 24, 2019

(65) Prior Publication Data
US 2020/0164634 A1    May 28, 2020

(30) Foreign Application Priority Data
Jul. 21, 2017 (GB) ...................................... 1711766

(51) Int. Cl.
*B41J 2/045* (2006.01)
*H01L 41/04* (2006.01)

(52) U.S. Cl.
CPC ......... *B41J 2/0455* (2013.01); *B41J 2/04586* (2013.01); *H01L 41/042* (2013.01)

(58) Field of Classification Search
CPC .............................. B41J 2/0455; B41J 2/04586
See application file for complete search history.

(56) References Cited

U.S. PATENT DOCUMENTS

2014/0240383 A1    8/2014  Penberth
2015/0015627 A1*   1/2015  Cleare ................... B41J 2/0455
                                                    347/9

FOREIGN PATENT DOCUMENTS

JP    5373609 B2    12/2013

OTHER PUBLICATIONS

International Search Report for Appln. No. PCT/GB2016/052061 dated Oct. 29, 2018, 13 pages.
Patents Act 1977: Search Report under Section 17(5) for Application No. GB17117661 4 dated Jan. 17, 2018, 3 pages.

* cited by examiner

*Primary Examiner* — Jason S Uhlenhake
(74) *Attorney, Agent, or Firm* — Dergosits & Noah LLP

(57) ABSTRACT

A driver circuit for receiving a voltage supply at a supply input and driving a load through a load output, the circuit comprising: a charge inductor and a discharge inductor; a switching array comprising a plurality of switches; and a load switch coupled between a first terminal of the charge inductor and the load output; the switching array being arranged so that: in a first mode it can couple a second terminal of the charge inductor to the supply input and the first terminal of the charge inductor to ground to load a flux on the charge inductor; in a second mode it can decouple the first terminal of the charge inductor from ground so that, when the load switch is closed, flux can flow from the inductor to the load output; and in a third mode it can couple the discharge inductor between the load output and ground so that flux can be loaded on the discharge inductor from the load output.

9 Claims, 4 Drawing Sheets

DRIVER CIRCUIT

CROSS-REFERENCE TO RELATED APPLICATIONS

The present Application claims the benefit of International Application No. PCT/GB2018/052061 entitled "DRIVER CIRCUIT," filed Jul. 20, 2018, which claims the benefit of Great Britain Patent Application No. 1711766.4, entitled "DRIVER CIRCUIT" filed on Jul. 21, 2017. The contents of International Application No. PCT/GB2018/052061 and Great Britain Patent Application No. 1711766.4 are hereby incorporated by reference.

FIELD OF DISCLOSURE

This invention relates to circuits for driving loads. In some situations the circuits may provide significantly improved efficiency. The loads may be capacitive loads such as multi-nozzle ink-jet printheads; however, the circuits could also be used for driving other types of capacitive loads.

BACKGROUND OF THE INVENTION

An ink-jet printhead typically comprises of a number of piezoelectric elements which are coupled to a driver circuit. The driver circuit can develop a voltage across each piezoelectric element which causes the element to distort. That distortion causes a droplet of ink to be expelled from the respective element of the printhead.

In the voltage domain, the waveform typically applied across a piezoelectric printhead element is a series of trapezoidal pulses. The trapezoids have rising and falling ramps connected by periods of time where the voltage remains constant. The constant voltage plateaux may be required to have any voltage between 0V and maximum output voltage, depending on factors such as the size of the droplet required and the current state of the piezoelectric element.

Typically, such waveforms are generated by a digital-to-analogue converter (DAC) whose output is fed into a linear amplifier. The output of the linear amplifier is coupled across the piezoelectric element so as to develop the required voltage across the piezoelectric element. A problem with the conventional approach is that the charge applied by the linear amplifier to the piezoelectric element is lost to ground after each actuation of the piezoelectric element. This is inefficient. In a large ink-jet printer the power consumed by driving the ink-jet heads can be considerable.

"MOSFET Current Source Gate Drivers, Switching Loss Modelling and Frequency Dithering Control for MHz Switching Frequency DC-DC Converters" (W A T Eberle) describes a current source gate drive circuit for power MOSFETs. In the circuit, an inductor stores gate energy and then returns it to the driver supply to recover some of the gate energy. To drive a power MOSFET the circuit provides a two-state output: high and low.

U.S. Pat. No. 9,079,396 discloses a driver for an ink-jet head in which a fly-back transformer is used to return some of the energy from the head to the input supply.

There is a need for an improved driver for driving entities such as piezoelectric elements in ink-jet printheads. Preferably such a driver should be capable of delivering pulses having a range of voltages.

SUMMARY OF THE INVENTION

According to one aspect there is provided a driver circuit for receiving a voltage supply at a supply input and driving a load through a load output, the circuit comprising: a charge inductor and a discharge inductor; a switching array comprising a plurality of switches; and a load switch coupled between a first terminal of the charge inductor and the load output; the switching array being arranged so that:

in a first mode, it can couple a second terminal of the charge inductor to the supply input and the first terminal of the charge inductor to ground to load a flux on the charge inductor;

in a second mode, it can decouple the first terminal of the charge inductor from ground so that, when the load switch is closed, flux can flow from the inductor to the load output; and in a third mode, it can couple the discharge inductor between the load output and ground so that flux can be loaded on the discharge inductor from the load output.

The charge inductor and the discharge inductor may be constituted by the same device. In that case, this aspect provides a driver circuit for receiving a voltage supply at a supply input and driving a load through a load output, the circuit comprising: an inductor; a switching array comprising a plurality of switches; and a load switch coupled between a first terminal of the inductor and the load output; the switching array being arranged so that:

in a first mode, it can couple a second terminal of the inductor to the supply input and the first terminal of the inductor to ground to load a flux on the charge inductor;

in a second mode, it can decouple the first terminal of the inductor from ground so that, when the load switch is closed, flux can flow from the inductor to the load output; and in a third mode, it can couple the inductor between the load output and ground so that flux can be loaded on the inductor from the load output.

The switching array may be arranged so that in a fourth mode it can couple the inductor or the discharge inductor between the supply input and the load output so that the inductor or the discharge inductor can be unset through the supply input.

The switching array may be arranged so that in a fifth mode it can couple the inductor or the discharge inductor between the supply input and the load output in the opposite sense to its coupling in the fourth mode to load a flux on the inductor or the discharge inductor.

The switching array may be arranged so that in a sixth mode it can couple the inductor or the charge inductor between the supply input and the load output in the opposite sense to its coupling in the first mode so that the inductor or the charge inductor can be unset through the supply input.

The driver circuit may comprise a controller configured to drive a single pulse cycle of the load by causing the switching array to adopt at least the following modes in the following order:
the first mode;
the second mode;
the third mode.

The driver circuit may comprise a controller configured to drive a single pulse cycle of the load by causing the switching array to adopt at least the following modes in the following order:
the first mode;
the second mode with the load switch closed;
the second mode with the load switch open;
the third mode.

The controller may be configured to drive the single pulse cycle of the load by causing the switching array to adopt, subsequent to the third mode, the fourth mode.

The controller may be configured to drive the single pulse cycle of the load by causing the switching array to adopt, prior to the third mode, the fifth mode.

The controller may be configured to drive the single pulse cycle of the load by causing the switching array to adopt, subsequent to the second mode, the sixth mode.

The controller may be implemented on a field-programmable grid array.

The charge and discharge inductors may be the same.

The switch array may comprise a first switch coupled between the first terminal of the charge inductor and the supply input. The switch array may comprise a second switch coupled between the second terminal of the charge inductor and the supply input. The switch array may comprise a third switch coupled between the first terminal of the charge inductor and ground. The switch array may comprise a fourth switch coupled between the second terminal of the charge inductor and ground.

In the first mode, the second and third switches may be closed. In the second mode, the first and fourth switches may be open.

In the second mode, the second switch may be closed and the first, third and fourth switches may be open.

In the third mode, the fourth switch may be closed and the first, second and third switches may be open.

In the fourth mode, the second and third switches may be closed and the first and fourth switches may be open.

In the fifth mode, the first and fourth switches may be closed and the second and third switches may be open.

In the sixth mode, the first and fourth switches may be closed and the second and third switches may be open.

The first, second, third and fourth switches may be identical.

The first, second, third and fourth switches may be N-type MOSFETs. The load switch may comprise two MOSFETs coupled in series.

According to a second aspect there is provided an electrical device comprising: a driver circuit as set out above; and a load coupled to the load output.

The load may be a capacitive load.

The electrical device may be a printer and the load may be a piezoelectric element of a printhead of the printer.

The printhead may be configured to eject material on application of a pulse to the piezoelectric element. The material may be ink.

The present invention will now be described by way of example with reference to the accompanying drawings. In the drawings:

BRIEF DESCRIPTION OF THE DRAWINGS

FIG. 1 shows an ink-jet printer, with an inset schematic cross-section of an ink-jet printer nozzle unit. The printer comprises a platen 1. A feedstock 2 on which printing is to take place is drawn over the platen by feed rollers 3. A printhead 4 is mounted over the platen and directed at the feedstock. The printhead contains one or more nozzle units for directing ink droplets at the feedstock. One nozzle unit is shown schematically at 5. The nozzle unit comprises an ink chamber 6 which contains ink. An orifice 7 communicates with the ink chamber. Opposite the orifice is a piezoelectric element 8. When the piezoelectric element is distorted by the application of an electric field across it, the piezoelectric element can cause ink to be ejected from the nozzle and directed at the feedstock. A driver unit 9 is coupled to the piezoelectric element. The driver unit is arranged to apply charge as desired across the piezoelectric element.

FIG. 2 shows a circuit suitable for serving as driver unit 9. The circuit comprises a main supply 20, a current source/sink 21 and a load switch 22. FIG. 2 shows a load 23 which represents the piezoelectric element 8.

Figure 1:
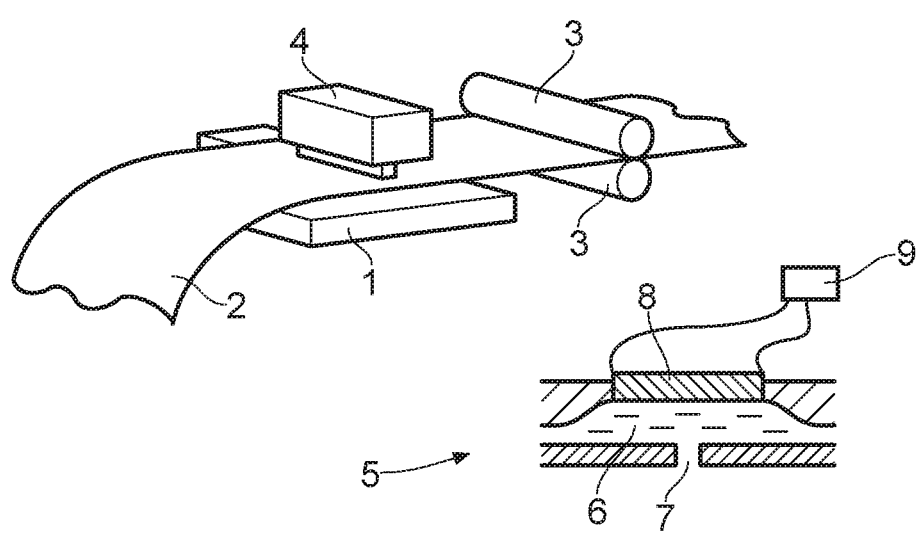
FIG. 1 is a schematic drawing of an ink-jet printer and a printhead.

The main supply 20 develops a supply voltage on supply rail 24.

The current source/sink 21 comprises a first switch M1 connected between the supply rail 24 and a node 26, a second switch M2 connected between the supply rail 24 and a node 25, a third switch M3 connected between node 26 and ground 27 and a fourth switch M4 connected between node 25 and ground 27. An inductor L1 is connected between nodes 25 and 26. In this example, switches M1, M2, M3 and M4 are MOSFET transistors. The switches could be implemented by any suitable devices, but it is preferred that they all are of the same channel type (N-type or P-type) since that may help to arrange that their switching times are similar. Most preferably they are all N-type MOSFET transistors. Most preferably they are all identical devices. It may be beneficial in some applications to have P-type MOSFETs for M1 and M2 (i.e. between the inductor and the supply rail) and N-type MOSFETs for M3 and M4 (i.e. between the inductor and ground). Then the gates of the MOSFETs can be driven from supplies which do not need to go above the main supply to turn on the top MOSFETs. Switches M2 and M4 are controlled by a first switch controller U1. Switches M1 and M3 are controlled by a second switch controller U2. Switch controller U1 receives inputs S2 and S4 which control the state of transistors M2 and M4 respectively. Switch controller U2 receives inputs S1 and S3 which control the state of transistors M1 and M3 respectively.

Node 26 serves as an output of the current source/sink 21. Node 26 is coupled to one side of load 23 via load switch 22. Load switch 22 is essentially a switch that controls whether node 26 is connected to or alternatively disconnected from load 23. In this example, load switch is constituted by two MOSFET transistors M5 and M6 which are controlled by switch controller U3. Switch controller U3 receives an input S5 which controls the state of both transistors M5 and M6. The load switch and its controller are configured so that transistors M5 and M6 are either both on or both off, so the load switch acts as a single switch for connecting or interrupting the link between the output of the current source/sink 21 and the load 23. In this implementation, the load switch 22 is implemented by a pair of MOSFETs set in series source to source. This allows the switch to prevent current flow in either direction when both MOSFETs are open. If a switching device that did not have an inherent diode were to be used then the load switch could be implemented by a single switching device. However, making the load switch 22 symmetrical in both directions (to and from the load) may make control of the circuit easier by reducing differences in propagation delays between the forward and reverse directions. The load switch could operate so as to allow only one MOSFET of the pair to be switched on at any one time. This would allow current to flow through the switch and the diode of the off MOSFET. This would involve more loss than with turning both MOSFETs on simultaneously.

The MOSFETs could, for example, be BSC093N04LS G devices.

Load 23 is represented as a capacitor C1. One side (28) of the capacitor is connected to node 26 via the load switch 22. The other side of the capacitor is connected to ground 29.

The operating modes of the circuit will now be described.

In a first "resting" mode of operation, the load switch M5, M6 is open, the inductor is disconnected from either supply or ground or both by arranging for any three or more of M1, M2, M3, M4 to be off. All of M1 to M4 may be off in this mode. The output capacitor has a constant voltage. This mode may occur when the inductor is not required for charging or discharging the load and a plateau in the output waveform is being produced.

In a second "charging", or "setting", mode of operation, switches M1 and M4 are open and switches M2 and M3 are closed. This leaves inductor L1 connected between the supply rail 24 and ground 27. As a result, flux is collected on inductor L1. The current in the inductor ramps up with what will be termed forward polarity.

In a third "driving" mode of operation, switches M1, M4 and M3 are open and switches M2, M5 and M6 are closed. This leaves inductor L1 connected between the supply rail 24 and the input node 28 of the load. Current flows from the supply rail 24 through the inductor. the voltage across the load capacitance ramps up as the load capacitance is charged.

In a fourth mode, the driving mode of operation can be interrupted by leaving switches M1, M2, M3 and M4 unchanged from the "driving" mode but by setting switches M5 and M6 to be open. This stops current from the inductor from passing to the load. This will be referred to as the "interrupted charge" mode. During this mode, both of the inductor terminals are connected to the supply rail via M2 and the intrinsic diode in M1. Since the voltage across the inductor is small the current in the inductor is substantially unchanged during this mode.

In a fifth "return", or "unsetting", mode of operation, switches M2, M3, M4, M5 and M6 are open, and switch M1 is closed. In this mode of operation, any surplus energy remaining in the inductor L1 can be returned to the main supply. The intrinsic diode of MOSFET M4 permits current to flow through M4. If a switch that did not have an intrinsic diode were used for M4 then a diode could be connected in parallel with that switch to permit current flow in the appropriate direction. The power supply 20 preferably incorporates an energy store, such as a capacitor coupled between the supply rail and ground, which can absorb the current returned from the inductor.

In a sixth "reverse charging", or "reverse setting", mode of operation, switches M2 and M3 are open and switches M1 and M4 are closed. This leaves inductor L1 connected between the supply rail 24 and ground 27. As a result, flux increases on inductor L1 as the current in the inductor ramps up. Because the state of switches M1 to M4 is reversed in comparison to the charging mode of operation, the current in the inductor ramps up with the opposite polarity to how it is loaded in the charging mode of operation. This will be termed reverse polarity.

In a seventh "discharge" mode of operation, switches M1, M2 and M3 are open and switches M4, M5 and M6 are closed. This leaves inductor L1 connected between the output capacitance node 28 and ground 27. As a result, the load can be discharged through the inductor.

In an eighth "interrupted discharging" mode of operation the discharging mode of operation can be interrupted by leaving switches M1, M2, M3 and M4 unchanged from the "discharging" mode but by setting switches M5 and M6 to be open. M5 and M6 are used to isolate the load capacitor. During this mode, both of the inductors terminals are clamped to ground via M4 and the intrinsic diode in M3. Since the voltage across the inductor is small the current in the inductor is substantially unchanged in this mode.

In a ninth "reverse return" mode of operation, switches M1, M4 M5 and M6 are open, and switches M2 and M3 are closed. In this mode of operation, any surplus energy remaining on inductor L1 can be returned to the main supply.

Switches M2 and M1 may be considered respectively to be forward and reverse interruptible connections between the inductor and the power supply. Switches M3 and M4 may be considered respectively to be forward and reverse interruptible connections between the inductor and ground. Switches M5 and M6 may, together, be considered to constitute an interruptible load connection. The following table sets out a possible logic for each operating mode.

TABLE 1

| Mode | Forward power supply connection (M2) | Reverse power supply connection (M1) | Forward ground connection (M3) | Reverse ground connection (M4) | Load connection (M5, M6) |
| --- | --- | --- | --- | --- | --- |
| Resting | Open | Open | Open | Open | Open |
| Charging | Closed | Open | Closed | Open | Open |
| Driving | Closed | Open | Open | Open | Closed |
| Interrupted Charging | Closed | Open | Open | Open | Open |
| Return | Open | Closed | Open | Open | Open |
| Reverse charging | Open | Closed | Open | Closed | Open |
| Discharge | Open | Open | Open | Closed | Closed |
| Interrupted Discharging | Open | Open | Open | Closed | Open |
| Reverse return | Closed | Open | Closed | Open | Open |

Figure 3:
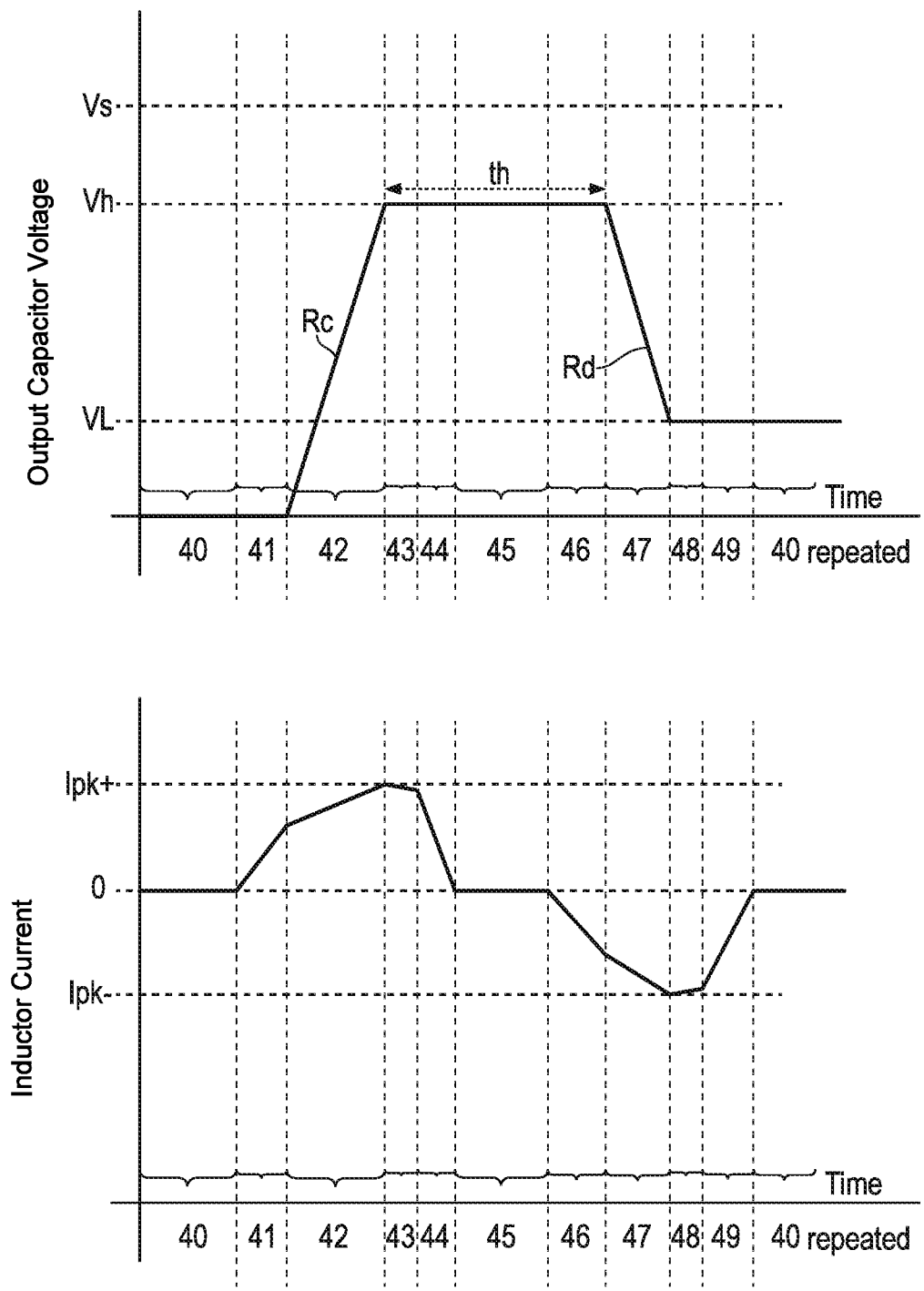
FIG. 3 is a plot of voltage against time illustrating stages in the driving of a load.

An operational cycle of the circuit involves charging the load to a desired voltage and at a desired charging rate, holding the load to retain that voltage on its input node 28 and then discharging the load at a desired discharge rate. FIG. 3 shows the voltage on node 28 during this cycle. It will be seen that the voltage has a generally trapezoidal form described by a charge rate indicated by slope $R_c$, a discharge rate indicated by slope $R_d$, a hold time $t_h$ and a hold voltage $V_h$ which is selected in the range from 0V to the supply voltage $V_s$. To achieve this pattern the modes described above are invoked in the following sequence.

1. The load (in this case capacitor C1) is initially uncharged. In phase 40 (see FIG. 3) the system is in the resting state.

2. In phase 41, the charging mode is invoked to pre-load the inductor L1 with forward polarity current. The magnitude of the current in the inductor at the end of period 41 depends on the duration of period 41 (and the supply voltage and value of inductance). The current in the inductor influences the rate at which the load will be charged in step 3 below. The duration of the charging period 41 can be selected in order to achieve a desired charge rate $R_c$ in that subsequent phase. The control mechanism for this will be discussed further below.

3. In phase 42 the driving mode is invoked. This causes the voltage on node 28 to rise. The rate of rise is influenced by the current in the inductor at the outset of driving period 42. When the voltage on node 28 reaches the desired value $V_h$ the load switch 22 is opened to stop the load from rising further.

4. When the load switch has been opened the system is in its interrupted mode at phase 43. In this state node 26 of the inductor swings high and the intrinsic diode of M1 conducts so that the voltage across the inductor is very small. The inductor current is substantially unchanged during this phase.

5. The return mode of operation is invoked at phase 44 to return any surplus energy in the inductor to the power supply. The inductor is connected between the supply and ground through MOSFETs M1 and M4 and resets into the supply rail.

6. When the current in the inductor has returned to zero, the system enters the rest state phase 45. All of the MOSFETs may be off or alternatively a single MOSFET in the H bridge (i.e. the arrangement constituted by the set of four switches arranged such that each end of the inductor can be connected high and/or low) may be turned on to connect one side of the inductor to supply or ground.

7. The reverse charging mode of operation is invoked at phase 46 to load the inductor with flux with reverse polarity i.e. the direction of current in the inductor is opposite of that in the forward polarity described above. The current in the inductor influences the rate at which the load will be discharged in step 8 below. The duration of the reverse charging period 46 can be selected in order to achieve a desired output capacitor discharge rate $R_d$ in that subsequent phase. The control mechanism for this will be discussed further below.

8. In phase 47 the discharge mode is invoked. The load is discharged into the inductor. The rate of discharge is influenced by the magnitude of the current in the inductor at the outset of discharge phase 47. The timing of the start of phase 47 after the end of phase 42 can be selected to achieve a desired hold time $t_h$.

9. In phase 48 the load has been isolated and the inductor has both terminals connected to ground through M4 and intrinsic diode of M3. The voltage across the inductor is small and the current in the inductor is substantially unchanged during this phase.

10. In phase 49 the reverse return mode is invoked to return any surplus energy in the inductor to the power supply.

11. After the end of phase 49 the system is again allowed to rest. Note that in FIG. 3 the phase after phase 49 is a recurrence of phase 40. In practice, a typical waveform might be formed by phases 40 to 49 being repeated many times in order, with differing $R_c$, $t_h$ and $R_d$ values in each cycle.

Consecutive steps may occur immediately after each other, or there may be a gap between steps. Either or both of the resting states (phases 40 and 45) may be omitted or their duration minimised, e.g. for efficiency. Similarly, either or both of phases 43 and 47 may be omitted or their duration minimised, e.g. for efficiency.

In summary, the inductor is set before the required rise in output voltage on the capacitive load. The inductor is then connected to the load and the output voltage on the load ramps up in a pseudo-linear manner with the inductor acting as a current source. When the voltage on the load has reached the required value then the load switch is opened and the output capacitor voltage remains at a constant value. The inductor then resets into the supply, dumping its energy back into the supply rail 24.

Before the required falling edge of the voltage on the load the inductor is again set but this time with the opposite polarity to the previous charging phase. The inductor is then connected to the load and acts as a current sink so that current flows out of the load into the inductor. The inductor is then clamped across the supply and resets back into the supply rail 24 thereby recycling the energy that was taken from the load.

Using the mechanism described above, energy can be recovered from the discharge of the load capacitance. This can improve the efficiency of the circuit as a driver.

During the cycle for generating each pulse, the resting mode is preferably adopted only once. During the cycle for generating each pulse, the charging mode is preferably adopted only once. During the cycle for generating each pulse, the driving mode is preferably adopted only once. During the cycle for generating each pulse, the interrupted charging mode is preferably adopted only once. During the cycle for generating each pulse, the return mode is preferably adopted only once. During the cycle for generating each pulse, the reverse charging mode is preferably adopted only once. During the cycle for generating each pulse, the discharge mode is preferably adopted only once. During the cycle for generating each pulse, the interrupted discharging mode is preferably adopted only once. During the cycle for generating each pulse, the reverse return mode is preferably adopted only once. During the cycle for generating each pulse preferably the interrupted charging mode is adopted immediately before and/or immediately after the driving mode. During the cycle for generating each pulse preferably the charging mode is adopted before the driving mode. During the cycle for generating each pulse preferably the return mode is adopted after the driving mode. During the cycle for generating each pulse preferably the return mode is adopted before the reverse charging mode. During the cycle for generating each pulse preferably the discharge mode is adopted after the reverse charging mode. During the cycle for generating each pulse preferably the interrupted discharge mode is adopted after the discharge mode. During the cycle for generating each pulse preferably the reverse return mode is adopted after the interrupted discharge mode. The driving mode is preferably adopted when the inductor is set with forward polarity. The discharge mode is preferably adopted when the inductor is set with reverse polarity. In the reverse return mode, preferably the inductor is connected in the opposite direction to the supply rail to how it is connected in the return mode. The circuit could be used for driving the load with a simple trapezoid pattern: that is a cycle in which the voltage on across the load transitions substantially linearly over time from a first value to a second value, is maintained at that second value for a first period of time, transitions substantially linearly over time from the second value to the first value, and is maintained at that first value for a second period of time until the start of the next cycle. The circuit could also be used for driving the load with a complex trapezoid pattern: that is a cycle in which, with the voltage across the load initially at a first value, (i) there are multiple repetitions of the steps of the voltage across the load being driven substantially linearly over time from its then-current value to another value, and then the voltage across the load being maintained at that other value; and then (ii) the voltage across the load is driven substantially linearly over time from its then-current value to the first value and maintained at the first value for a period of time until the start of the next cycle. In the simple trapezoidal mode, successive voltage ramps are of the same magnitude and in opposite directions. In the complex trapezoidal mode, successive voltage ramps may be of the same or different magnitudes and may be in the same or opposite directions.

It is not necessary for the charge received from the load to be returned to the same inductor that was used to charge the load. The circuit could work with the same energy efficiency if separate inductors were used for charging and discharging, although more components would be needed. In an arrangement that used separate inductors for charging and discharging it may be possible to omit the phases 44 and/or 48 of returning current from the inductors to the power supply since the inductors could be set with the same polarity at each use. A suitable circuit for implementing this could comprise a duplicated current source/sink of the type shown in FIG. 2 connected via a duplicated load switch to line 28. A circuit of this type will be discussed in more detail below. Further, by having a duplicated circuit then a further mode is possible. In the single stage circuit with a single inductor it is desirable for the inductor to be completely discharged after each edge so that it can be used for the next edge, in case that next edge is in the opposite direction. When two inductors are used: one for charging the output capacitor and the other for discharging the output capacitor; then complete inductor discharge can be avoided because an inductor can be used always for driving in a single direction. An inductor can be topped up ready for driving the next edge of the same polarity as the last edge it drove, rather than emptied. This could be efficiently implemented by shorting an inductor by means of a pair of MOSFETs in such a way as to hold the current in the inductor at a predetermined level. For example, MOSFETs M3 and M4 could be used to do this when clamping the inductor to the ground node 27. Similarly, M1 and M2 when clamping the inductor to the supply rail 24. Then the current could be topped up as described above. In such a circuit phases 43 and/or 47 could be allowed to persist until topped up again in phases 41 and 45 of a later cycle.

Even with a single inductor, phase 44 could be omitted if the inductor were to be set during phase 41 such that it was substantially emptied into the load during phase 42, or if losses due to the inductor retaining forward flux were accepted during phase 45.

An alternative drive mode 42 and discharging mode 47 are possible. In the alternate drive mode, after L1 is set in the usual way during phase 41. M2 and M3 are turned off and M4 is turned on. The inductor then resets between ground and the load which is then charged entirely from the energy stored in L1 (rather than from the positive supply and the energy stored in L1 as in the normal mode). Similarly, the alternative discharge mode 47 could be achieved by arranging for the inductor to be set in the reverse direction in phase 46 by switching on M1 and M4 in the usual way but at the start of phase 47 M1, M4 are switched off and M2 is switched on. The inductor then resets between the supply rail and the output capacitance and the output capacitance is discharged entirely from the energy stored in the inductor.

With suitable control applied, the circuit could be operated with a combination of the normal and alternative modes as a means of improving efficiency for waveforms of varying form over time.

The inductor L1 could be comprised of a single inductive device or multiple inductive devices.

The current in the inductor L1 may be estimated by $$V = L \cdot di/dt,$$

where V is the voltage applied across the inductor, L is the inductance of L1 and di/dt is the rate of change in current. This can be restated as $$V = L \cdot Ipk/Ton$$

where Ipk is the current in the inductor after V has been applied for Ton seconds. The shape of the waveform with which it is desired to drive the load, and its desired timing, will dictate the amount of time Ton available to set the inductor. The required output voltage ramp time will dictate the current required to charge the output capacitor as derived from $$I = C \cdot dv/dt$$

where I is the required current and C is the capacitance of the load.

Taking as an example the case where C=120 nF and it is required to charge the load to 40V with an edge speed of 100 V/μs, the ramp duration is 400 ns and the required charge current is 12 A. So, in this case inductor should be charged to 12A and this current then allowed to flow into the output load. It is preferred that the inductor is relatively large since in that case the current can be expected to remain substantially constant as the inductor continued to charge during the rise. This arrangement suggests a relatively long pre-charge period relative to the rise time and a large inductor.

The charging period might be such that the inductor current would be charged to a value lower than the target value at the end of the pre-charge period. Nevertheless, the circuit can deliver the required driving effect if the inductor current has risen to the target value or higher by the end of the rise in driven output voltage. This way of working can help to avoid the need for excessively large inductors.

The inductor charge time Ton is made up of the pre-charge time before the capacitor voltage edge plus the rise time of the edge as the inductor is still connected to the supply and current is flowing into it during the time of the rising edge also. Thus, the voltage across the inductor may initially be the full supply voltage, and then later fall as the capacitor voltage rises during the capacitor voltage rise time. As a rough approximation, the voltage across the inductor during the rise time of the capacitor voltage may be given by $$V\text{supply} - (V\text{cap final} - V\text{cap initial})/2.$$

The highest demand in the inductor might be expected to be when the voltage transition on the load is required to go from ground to the full supply voltage. The inductor can usefully be sized for this condition.

For a linearly ramped waveform, the average voltage across the inductor during the rise time is Vsupply/2. Given the ramp-like rising edge, this can be approximated to Vsupply applied for half of the edge rise time. If the supply voltage Vsupply is assumed to be applied across the inductor for the entirety of the on time Ton, Ton can be approximated as Tpre+Trise/2, where Tpre is the pre-charge time and Trise is the rise time. The waveform rise time Trise is defined by waveform requirements. The pre-charge time Tpre may be adjusted to allow the optimisation of inductor value and efficiency.

The inductor may be assumed to be charged prior to the rising edge and also during the rising edge, and discharged immediately after the rising edge so that it can be used again before the next edge. In this operating pattern, for an example simple trapezoidal 200 kHz waveform where the duration of the plateau is 2 μs with 400 ns rise and fall times then Ton could be up to 1 μs to allow for the inductor to be discharged after the rising edge and then charged again before the falling edge. This would require an 800 ns pre-charge for the 400 ns rise time to give total effective Ton of 1 μs during which Vsupply is applied across L. In this example, for a supply voltage Vsupply of 40V and a required current I of 12 A, L could be sized at 3.3 μH. A larger value of L and a longer pre-charge period could be used to make the inductor current larger at the beginning of the edge rise and more constant throughout the rise. It will be appreciated that the analysis above is simplified. Experimentation with inductor values could allow efficiency and waveform quality to be improved.

It is convenient to interrupt driving the load using the load switch 22 because that may permit precise control of the end time of the driving phase 42, e.g. by reducing the influence of propagation delays. However, it would be possible to omit phase 43 and to transition from the driving phase directly to the return phase 44 at the end of the driving phase. It may be desirable to invoke the interrupted mode between after the charge phase and immediately before the driving phase so that the start time of the driving phase can be governed by the load switch. This may permit a more precise control of the start time of the driving phase 42, e.g. by reducing the influence of propagation delays. For a similar reason, it may be desirable to have the start time of the discharge phase 47 governed by the load switch. To do that the system could enter an "interrupted discharge" mode immediately prior to phase 45. The interrupted discharge mode is the same as the discharge mode but with the load switch open as shown in Table 1.

Figure 2:
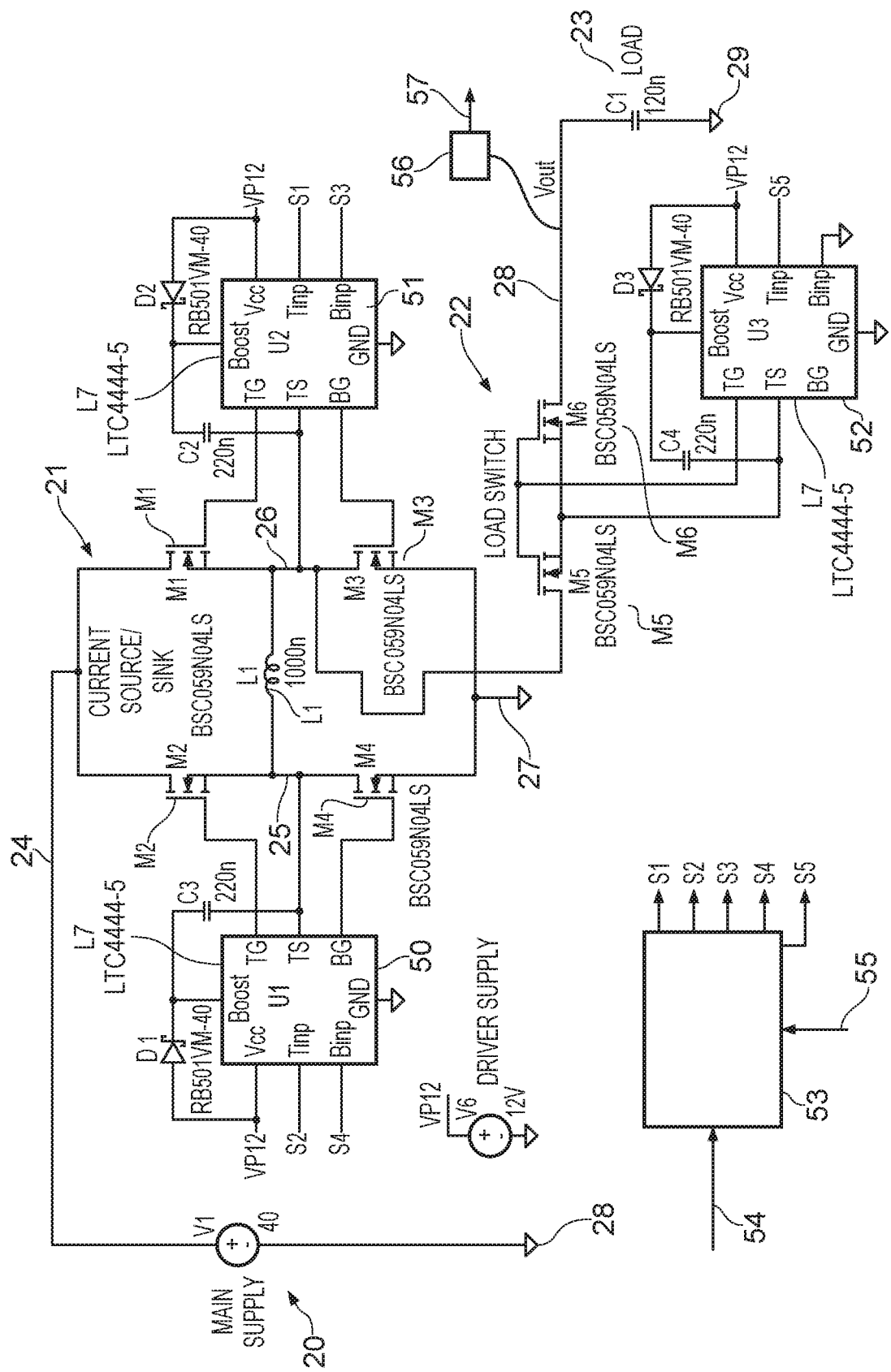
FIG. 2 shows a printhead driver circuit.

Circuits other than the H-bridge of FIG. 2 could be used to reverse the sense in which the inductor is connected to the power supply and to the load.

In the circuit of FIG. 2, the MOSFET switches are controlled by MOSFET controllers 50, 51, 52. These are implemented by LTC4444-5 devices. Other devices could be used. The MOSFET controllers receive inputs S1, S2, S3, S4 which indicate the required state for switches M1, M2, M3, M4 respectively, and an input S5 which indicates the required state for switches M5 and M6. MOSFET controller 52 is connected to switches M5 and M6 so that they both have the same state at any time, that state being dependent on the signal at input S5. The signals at S1 to S5 are generated by a control unit 53. Control unit 53 is configured to generate appropriate output signals on S1 to S5 in dependence on a control input received at 54. The control input may, for instance indicate the desired values of $R_c$, $t_h$ and $R_d$ for a pulse cycle, together with a time for the start of the up-ramp on the load voltage. The desired performance could be communicated to the controller in other ways. The controller may determine the appropriate outputs S1 to S5 and their timings by means of software and/or hardware. In one potential implementation, the controller is hard-wired with logic to produce the required outputs. In another potential implementation, the controller comprises a data processor and a memory storing in a non-transient way code executable by the processor to generate the outputs. The controller may operate in dependence on a clock arranged to step the state of the outputs through a predetermined series of states. In this implementation, the resolution of the clock influences the resolution with which the circuit can achieve a desired voltage pattern on the load. For illustration, an ink-jet printhead might require a 40V pulse with a slew rate ($R_c$) of 100 V/μs. That equates to a rise time (the duration of phase 42) of 400 ns. In this example, a clock period of 4 ns would give a 1% voltage resolution. Clocks of this period are readily available. In comparison, in drivers that employ linear voltage amplifiers considerable complexity might be required to achieve accurate slew rates of 100 V/μs. The controller 53 could conveniently be implemented on a field-programmable gate array (FPGA).

To allow the system to be operated precisely, for example to account for tolerances in the supply rail voltage, the inductor value, the capacitance of the load and propagation delays, it could be calibrated by sampling the voltage on the load at 28. This could be done by an analogue-to-digital converter 56 which samples the voltage at 28 and generates an output at 57. The output 57 is passed to the controller 53 at 55. In the controller, the value of the input at 55 is used as feedback to influence future outputs to S1 to S5 to better achieve conformity to a desired operating scheme.

Similarly, by having the system able to measure the current in the inductor by means of an ADC which monitors the output of a current transformer in series with the inductor, or monitors the voltage across a small resistor in series with the inductor, or otherwise, would allow the controller to adjust the lengths of controlling pulse widths in order to optimise the current waveform in the inductor. This implementation might allow the circuit to be more tolerant to device parameter variations.

Figure 4:
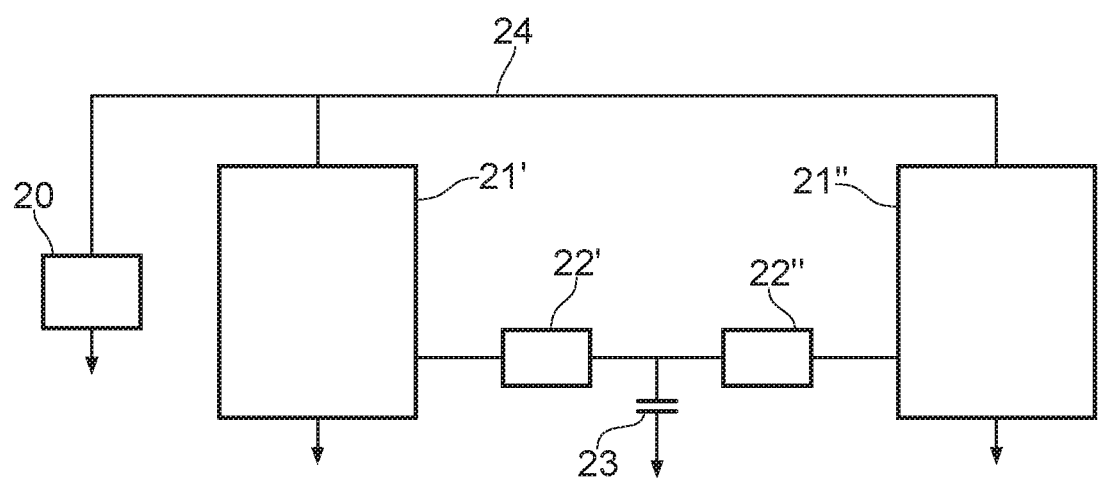
FIG. 4 shows a driver circuit having duplicated blocks.

FIG. 4 shows an alternative circuit comprising duplicated current sources/sinks and load switches. The components are numbered as in FIG. 2. The duplicated current sources/sinks are designated 21' and 21". Each one contains a switched H-bridge with an inductor. The duplicated load switches are designated 22' and 22". One or more controllers (not shown in FIG. 4) are provided to control the switches in blocks 21', 21", 22', 22". Each current source/sink has a respective inductor. One use of a circuit of this nature is to charge and discharge load 23 with one or more pulses of trapezoidal shape, as shown in FIG. 3. In that implementation one of blocks 21',21" can be used to charge the load 23 and the other can be used to discharge the load. This means that the inductor of one block is used as a charge inductor and the other is used as a discharge inductor, whereas in the circuit of FIG. 2 inductor L1 performs both functions. Depending on whether a load switch is to be used during the discharge phase, the load switch to the discharge block 21', 21" may be omitted. Another use of the circuit of FIG. 4 is to charge and discharge load 23 with pulses of a more complex shape than trapezoidal. In order to recover energy from the load 23 using a single current source/sink, there should be a period during which the inductor of that single current source/sink is charged for an upcoming charge or discharge phase of the load (i.e. phase 41 or 46). During that phase, the inductor is not connected to the load so it cannot be used to charge or discharge the load. In the circuit of FIG. 2, that results in the voltage on the load remaining static during those phases. With the circuit of FIG. 4, the current sources/sinks 21', 21" can be used alternately. Immediately after one of those blocks has charged the load to some extent at a first rate, the other of those blocks can be used to charge or discharge the load at a second rate. The first and second rates are dependent on the state of charge of the inductor of the respective block before the respective charging/discharging phase, so the first and second rates may be the same or different. Immediately after one of those blocks has discharged the load to some extent at a third rate, the other of those blocks can be used to charge or discharge the load at a fourth rate. The third and fourth rates are dependent on the state of flux of the inductor of the respective block before the respective charging/discharging phase, so the third and fourth rates may be the same or different. In this way, the blocks 21' and 21" may be used to impose a pulse on the load that has charge and/or discharge rates which vary over time and/or that has no intermediate static voltage period between successive charge/discharge phases. The shape of the pulse depends on the manner in which the current sources/sinks 21', 21" are controlled, but it could, for example, be substantially sinusoidal.

The circuit of FIG. 4 shows two driver blocks, each comprising a current source/sink and a load switch, coupled to a load. There could be more than two such driver blocks coupled to a load for driving it.

The circuits described above may be used to drive the piezoelectric element of an ink-jet printhead. In that case, the piezoelectric element would serve as load 23. In other applications, the circuits could drive other devices, for example loudspeakers (including headphone loudspeakers), lighting units, semiconductor clock circuit inputs and piezoelectric elements. The driver circuit is particularly but not exclusively suitable for driving capacitive loads.

When the circuit is being used to drive a complex printhead, the capacitance of the printhead will vary as a function of the number of nozzles that are being fired. Controller 53 can model this variation and adjust the timings of the signals on lines to S1 to S4 to the appropriate value of capacitance at any particular time. The system could be calibrated experimentally. It might be advantageous to pad the printhead with an additional capacitance so that the load capacitance never reached zero. The additional capacitance could be switched out by controller 53 when the printhead had capacitance, e.g. when more than a small number of nozzles were being fired. This may improve waveform quality in an implementation where the printhead and the driver were separated by a long link which might exhibit its own inductance. The additional capacitance could be implemented by one or more dummy printhead nozzles piezoelectric elements which do not jet ink but do have capacitance. These could be switched into the load by controller 53 when required.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A driver circuit for receiving a voltage supply at a supply input and driving a load through a load output, the circuit comprising:
   an inductor;
   a load switch coupled between a first terminal of the inductor and the load output; and
   a switching array comprising a first switch coupled between the first terminal of the inductor and the supply input, a second switch coupled between a second terminal of the inductor and the supply input, a third switch coupled between the first terminal of the inductor and ground and a fourth switch coupled between the second terminal of the inductor and ground, wherein:
      in a first mode, the switching array couples the second terminal of the inductor to the supply input and the first terminal of the inductor to ground to load a flux on the inductor;
      in a second mode, the switching array decouples the first terminal of the inductor from ground so that, when the load switch is closed, flux can flow from the inductor to the load output;
      in a third mode, the switching array couples the inductor between the load output and ground so that flux can be loaded on the inductor from the load output; and
      in a fourth mode, the switching array couples the inductor between the supply input and the load output so that the inductor can be unset through the supply input.

2. The driver circuit as claimed in claim 1, wherein in the first mode the second and third switches are closed and first and fourth switches are open.

3. The driver circuit as claimed in claim 1, wherein in the second mode the second switch is closed and the first, third and fourth switches are open.

4. The driver circuit as claimed in claim 1, wherein in the third mode the fourth switch is closed and the first, second and third switches are open.

5. The driver circuit as claimed in claim 1, wherein in the fourth mode the second and third switches are closed and the first and fourth switches are open.

6. A driver circuit for receiving a voltage supply at a supply input and driving a load through a load output, the circuit comprising:
   an inductor;
   a load switch coupled between a first terminal of the inductor and the load output; and
   a switching array comprising a first switch coupled between the first terminal of the inductor and the supply input, a second switch coupled between a second terminal of the inductor and the supply input, a third switch coupled between the first terminal of the inductor and ground and a fourth switch coupled between the second terminal of the inductor and ground, wherein:
      in a first mode, the switching array couples the second terminal of the inductor to the supply input and the first terminal of the inductor to ground to load a flux on the inductor;
      in a second mode, the switching array decouples the first terminal of the inductor from ground so that, when the load switch is closed, flux can flow from the inductor to the load output;
      in a third mode, the switching array couples the inductor between the load output and ground so that flux can be loaded on the inductor from the load output; and
      in a fourth mode, the switching array couples the inductor between the supply input and the load output so that the inductor can be unset through the supply input;
      in a fifth mode, the switching array couples the inductor between the supply input and the load output in the opposite sense to its coupling in the fourth mode to load a flux on the inductor, and wherein in the fifth mode the first and fourth switches are closed and the second and third switches are open.

7. A driver circuit for receiving a voltage supply at a supply input and driving a load through a load output, the circuit comprising:
   an inductor;
   a load switch coupled between a first terminal of the inductor and the load output; and
   a switching array comprising a first switch coupled between the first terminal of the inductor and the supply input, a second switch coupled between a second terminal of the inductor and the supply input, a third switch coupled between the first terminal of the inductor and ground and a fourth switch coupled between the second terminal of the inductor and ground, wherein:

in a first mode, the switching array couples the second terminal of the inductor to the supply input and the first terminal of the inductor to ground to load a flux on the inductor;

in a second mode, the switching array decouples the first terminal of the inductor from ground so that, when the load switch is closed, flux can flow from the inductor to the load output;

in a third mode, the switching array couples the inductor between the load output and ground so that flux can be loaded on the inductor from the load output; and in a fourth mode, the switching array couples the inductor between the supply input and the load output so that the inductor can be unset through the supply input;

in a sixth mode, the switching array couples the inductor between the supply input and the load output in the opposite sense to its coupling in the first mode so that the inductor can be unset through the supply input, wherein in the sixth mode the first and fourth switches are closed and the second and third switches are open.

8. The driver circuit as claimed in claim 7, further comprising a controller configured to drive a single pulse cycle of the load by causing the switching array to adopt at least the following modes in the following order: the first mode, the second mode, and the third mode; wherein the controller is configured to drive the single pulse cycle of the load by causing the switching array to adopt, subsequent to the second mode, the sixth mode; and wherein the first, second, third and fourth switches are identical.

9. The driver circuit as claimed in claim 8, wherein the first, second, third and fourth switches are N-type MOSFETs.

* * * * *